United States Patent
Schacham-Diamand et al.

[11] Patent Number: 5,824,599
[45] Date of Patent: Oct. 20, 1998

[54] PROTECTED ENCAPSULATION OF CATALYTIC LAYER FOR ELECTROLESS COPPER INTERCONNECT

[75] Inventors: Yosef Schacham-Diamand, Ithaca, N.Y.; Valery M. Dubin, Cupertino; Chiu H. Ting, Saratoga, both of Calif.; Bin Zhao; Prahalad K. Vasudev, both of Austin, Tex.; Melvin Desilva, Dallas, Tex.

[73] Assignees: Cornell Research Foundation, Inc., Ithaca, N.Y.; Intel Corporation, Santa Clara, Calif.; Sematech, Inc., Austin, Tex.

[21] Appl. No.: 587,264

[22] Filed: Jan. 16, 1996

[51] Int. Cl.$^6$ ................................................. H01L 21/44
[52] U.S. Cl. ............................................................. 438/678
[58] Field of Search .......................... 437/230; 438/608, 438/625, 642, 650, 652, 629, 678, 687

[56] References Cited

U.S. PATENT DOCUMENTS

| | | | |
|---|---|---|---|
| 4,574,095 | 3/1986 | Baum et al. | 427/53.1 |
| 4,789,648 | 12/1988 | Chow et al. | 437/225 |
| 4,894,260 | 1/1990 | Kumasaka et al. | 427/241 |
| 4,985,750 | 1/1991 | Hoshino | 357/71 |
| 5,151,168 | 9/1992 | Gilton et al. | 205/123 |
| 5,183,795 | 2/1993 | Ting et al. | 437/230 |
| 5,192,581 | 3/1993 | Hirsch et al. | 427/556 |
| 5,240,497 | 8/1993 | Shacham et al. | 106/1.26 |
| 5,580,668 | 12/1996 | Kellam | 428/610 |

OTHER PUBLICATIONS

"Copper Interconnection with Tungsten Cladding for ULSI;" J.S.H. Cho et al.; VLSI Tech Symp.; 1991;pp. 39–40.

"Encaspsulated Copper Interconnection Devices Using Sidewall Barriers;" Donald S. Gardner et al.; 1991 VMIC Conference; Jun. 11–12, 1991; pp. 99–108.

"Planar Copper–Polyimide Back End Of The Line Interconnections For ULSI Devices;" B. Luther et al.; 1993 VMIC Conference; Jun. 8–9, 1993; pp. 15–21.

"Electroless Cu for VLSI;" James S.H. Cho et al.; MRS Bulletin/Jun. 1993; pp. 31–38.

"Electroless Copper Deposition on Metals and Metal Silicides;" Cecilia Y. Mak; MRS Bulletin/Aug. 1994; pp. 55–62.

"Development Of An Electroless Copper Deposition Bath For Via Fill Applications On TiN Seed Layers;" Roger Palmans et al.; Conf. Proc. ULSI–X; Materials Research Society; 1995; pp. 87–94.

(List continued on next page.)

*Primary Examiner*—Charles L. Bowers, Jr.
*Assistant Examiner*—Reneé R. Berry

[57] ABSTRACT

A method for utilizing electroless copper deposition to form interconnects on a semiconductor. Once a via or a trench is formed in a dielectric layer, a titanium nitride (TiN) or tantalum (Ta) barrier layer is deposited. Then, a catalytic copper seed layer is conformally blanket deposited in vacuum over the barrier layer. Next, without breaking the vacuum, an aluminum protective layer is deposited onto the catalytic layer to encapsulate and protect the catalytic layer from oxidizing. An electroless deposition technique is then used to auto-catalytically deposit copper on the catalytic layer. The electroless deposition solution dissolves the overlying protective layer to expose the surface of the underlying catalytic layer. The electroless copper deposition occurs on this catalytic surface, and continues until the via/trench is filled. Subsequently, the copper and barrier material are polished by an application of chemical-mechanical polishing (CMP) to remove excess copper and barrier material from the surface, so that the only copper and barrier material remaining are in the via/trench openings. Then an overlying silicon nitride (SiN) layer is formed above the exposed copper in order to form a dielectric barrier layer. The copper interconnect is fully encapsulated from the adjacent material by the TiN (or Ta) barrier layer and the overlying SiN layer.

22 Claims, 9 Drawing Sheets

OTHER PUBLICATIONS

"Selective and Blanket Electroless Cu Plating Initiated By Contact Displacement For Deep Submicron Via Contact Filling;" Dubin et al.; VMIC Conf.; Jun. 27–29, 1995; pp. 315–321.

"0.35 um Cu–Filled Via Holes By Blanket Deposited Electroless Copper On Sputtered Seed Layer;" Yosi Shacham–Diamand et al.; VMIC Conf.; Jun. 27–29, 1995; pp. 334–336.

"Barriers Against Copper Diffusion into Silicon and Drift Through Silicon Dioxide;" Shi–Qing Wang; MRS Bulletin/Aug. 1994, pp. 30–40.

"Inlaid Copper Multilevel Interconnections Using Planarization by Chemical–Mechanical Polishing;" S.P. Murarka et al.; MRS Bulletin/Jun. 1993; pp. 46–51.

"Electrochemically Deposited Diffusion Barriers;" M. Paunovic; et al.; J. Electrochem. Soc., vol. 141 No. 7; Jul. 1994; pp. 1843–1850.

"Electroless Copper Deposition For Multilevel Metallization;" S. Simon Wong et al.; Mat. Res. Soc. Symp. Proc. vol. 203; 1991 Materials Research Society; pp. 347–356.

"Electroless plating of copper at a low pH level;" R. Jagannathan et. al.; IBM J. Res. Develop. vol. 37 No.2; Mar. 1993; pp. 117–123.

"Selective Electroless Metal Deposition for Integrated Circuit Fabrication;" Chiu H. Ting et al.; J. Electrochem. Soc. vol. 136, No.2; Feb. 1989; pp. 456–462.

"Selective Electroless Metal Deposition for Via Hole Filling in VLSI Multilevel Interconnection Structures;" Chiu H. Ting et al.; J. Electrochem. Soc., vol. 136, No. 2; Feb. 1989; pp. 462–466.

"Pd/Si plasma immersion ion implantation for selective electroless copper plating on Si02;" M.–H. Kiang et al.; Appl. Phys. Lett. 60(22); Jun. 1, 1992; pp. 2767–2769.

"Selective electroless Ni deposition on a TiW underlayer for integrated circuit fabrication;" V.M. Dubin et al.; Thin Solid Films, 226(1993) ; pp. 87–93.

"Copper Corrosion With and Without Inhibitors;" V. Brusic et al.; J. Electrochem. Soc., vol. 138, No. 8; Aug. 1991; pp. 2253–2259.

"100 nm wide copper lines made by selective electroless deposition;" Yosi Shacham–Diamand; J. Micromech. Microeng. 1 (1991); pp. 66–72.

"Passivation of Copper by Silicide Formation In Dilute Silane;" S. Hymes et al.; Conf. Proc. ULSI–VII, Materials Research Society; 1992; pp. 425–431.

"A Half–Micron Pitch Cu Interconnection Technology;" Kazuyoshi Ueno et al.; 1995 Symposium on VLSI Technology Digest of Technical Papers; 1995; pp. 27–28.

"Electroless Metal Deposition From Aqueous Solutions;" V.V. Sviridov; Minsk Bielorussian State University; 1987; pp. 60–85.

PROTECTED ENCAPSULATION OF CATALYTIC LAYER FOR ELECTROLESS COPPER INTERCONNECT

BACKGROUND OF THE INVENTION

1. Field of the Invention

The present invention relates to the field of semiconductor manufacturing techniques and, more particularly, to a technique for fabricating copper interconnects by electroless metallization.

2. Prior Art

In the manufacture of devices on a semiconductor wafer, it is now the practice to fabricate multiple levels of conductive (typically metal) layers above a substrate. The multiple metallization layers are employed in order to accommodate higher densities as device dimensions shrink well below one micron design rules. Thus, semiconductor "chips" having three and four levels of metallization are becoming more prevalent as device geometries shrink to sub-micron levels.

One common metal used for forming metal lines (also referred to as wiring) on a wafer is aluminum. Aluminum is used because it is relatively inexpensive compared to other conductive materials, it has low resistivity and is also relatively easy to etch. Aluminum is also used as a material for forming interconnections in vias to connect the different metal layers. However, as the size of via/contact holes is scaled down to a sub-micron region, the step coverage problem appears, which has led to reliability problems when using aluminum to form the interconnection between different wiring layers. The poor step coverage in the sub-micron via/contact holes result in high current density and enhance the electromigration.

One approach to providing improved interconnection paths in the vias is to form completely filled plugs by utilizing metals, such as tungsten. Thus, many semiconductor devices fabricated utilizing the current state of VLSI (Very Large Scale Integration) technology employ the use of aluminum for the wiring and tungsten plugs for providing the interconnection between the different levels of wiring. However, there are disadvantages of using tungsten as well. Mostly, tungsten processes are complicated and appreciably expensive. Tungsten also has high resistivity. The Joule heating may enhance the electromigration of adjacent aluminum wiring. Furthermore, tungsten plugs are susceptible to the presence of voids and form poor interface with the wiring layers which usually result in high contact resistance. Another solution for the plug interconnects is the use of aluminum plugs, which can be fabricated by chemical vapor deposition (CVD) or physical vapor deposition (PVD) at elevated temperatures. The CVD aluminum is proven to be expensive and the hot PVD aluminum usually requires very high process temperatures that sometimes is not compatible with the manufacturing of integrated circuits.

One material which has received considerable attention as a replacement material for VLSI interconnect metallizations is copper. Since copper has better electromigration property and lower resistivity than aluminum, it is a more preferred material for interconnect (plugs and wiring) formation than aluminum. In addition, copper has improved electrical properties than tungsten, making copper a desirable metal for use as plugs. However, one serious disadvantage of using copper metallization is that it is difficult to etch. Thus, where it was relatively easier to etch aluminum or tungsten after depositing them to form wiring lines or plugs (both wiring and plugs are referred to as interconnects), substantial additional cost and time are now required to etch copper.

One typical practice in the art is to fabricate copper plugs and wiring by inlaid (Damascene) structures by employing CMP (see for example, U.S. Pat. No. 4,789,648). However, since copper diffuse/drift easily in inter-level-dielectric (ILD) materials, such as $SiO_2$ based ILD materials, copper interconnect structures must be encapsulated by diffusion barrier layers. (See for example, "Barriers Against Copper Diffusion into Silicon and Drift Through Silicon Dioxide;" Shi-Qing Wang; MRS Bulletin; August 1994; pp. 30–40; "Encapsulated Copper Interconnection Devices Using Sidewall Barriers;" Donald S. Gardner et al.; 1991 VMIC Conference; Jun. 11–12, 1991; pp. 99–108; and "Copper Interconnection with Tungsten Cladding for ULSI;" J. S. H. Cho et al.; VLSI Symposium; 1991; pp. 39–40). Accordingly, it is a common practice to use diffusion barrier metals, such as titanium nitride (TiN) or titanium tungsten (TiW), as well as dielectric barrier materials, such as silicon nitride (SiN), to encapsulate copper. Typically, the use of diffusion barrier material to encapsulate copper is not limited to the copper-ILD interface, but also to interfaces with other metals as well, if there are other such metals.

To replace the tungsten and/or aluminum interconnect structures with copper interconnects in VLSI (or ULSI) manufacturing, another important factor to consider is the process cost. One technique of depositing copper, as well as other metals, is the use of electroless deposition (See for example, "Electroless Cu for VLSI;" James S. H. Cho et al.; MRS Bulletin; June 1993; pp. 31–38; "Selective Electroless Metal Deposition For Integrated Circuit Fabrication;" Chiu H. Ting et al.; J. Electrochem. Soc., 136; 1989; p. 456 et seq.; "Selective Electroless Metal Deposition For Via Hole Filling In VLSI Multilevel Interconnection Structures;" Chiu H. Ting et al.; J. Electrochem. Soc., 136; 1989; p.462 et seq.; and U.S. Pat. No. 5,240,497).

In comparison to other copper deposition techniques, electroless copper deposition is attractive due to the low processing cost and high quality of copper deposited. The equipment for performing electroless metal deposition are relatively less expensive, as compared to other semiconductor equipment for depositing metals, and the technique allows for batch processing of wafers. Thus, overall cost can be reduced by using electroless deposition. However, electroless deposition requires a catalytic surface for the auto-catalytic reaction to occur (See for example, U.S. Pat. No. 4,574,095 and "Electroless Copper Deposition on Metals and Silicides;" Cecilia Y. Mak; MRS Bulletin; August 1994; pp. 55–62). It is difficult to obtain reliable and reproducible electroless copper deposition, since the surface needs to maintain the same catalytic property.

The present invention describes a technique of utilizing electroless metallization to form copper interconnect structures by employing a copper catalytic layer to initiate the autocatalytic process of electroless deposition and the use of a protective layer to protect the catalytic surface until the wafer is subjected to the electroless deposition solution. The practice of the present invention is used to fabricate interconnect structures of multi-level semiconductor devices, where the electroless deposition process is made more reliable and reproducible.

SUMMARY OF THE INVENTION

The present invention describes a method for utilizing electroless copper deposition to form interconnects on a semiconductor. Once a via or a trench is formed in a dielectric layer, a titanium nitride (TiN) or tantalum (Ta) barrier layer is blanket deposited. An optional adhesion promoter layer comprised of titanium may be desirable to pre-treat the dielectric surface, in order to improve the adhesion bonding of TiN or Ta to the dielectric material. Then, a catalytic seed layer, preferably of copper, is conformally blanket deposited over the barrier layer. This catalytic layer is used to initiate the electroless copper deposition during a later step. The catalytic layer is deposited in vacuum.

Then, without breaking the vacuum, a protective layer is deposited onto the catalytic layer to encapsulate and protect the catalytic layer from oxidizing. The preferred material for the protective layer is aluminum. The aluminum and the aluminum-copper alloy formed at the interface of the catalytic and protective layers encapsulate the underlying copper so that oxidation of the catalytic layer will not occur until the surface is subjected to the electroless deposition solution.

After the formation of the layers described above, an electroless deposition technique of the present invention is then used to auto-catalytically deposit copper on the catalytic layer. The electroless deposition solution dissolves the overlying protective layer (including the alloy) to expose the surface of the underlying catalytic layer. The electroless copper deposition occurs on this catalytic surface, and continues until the via/trench is/are filled. Subsequently, the copper is polished by an application of chemical-mechanical polishing (CMP) to remove the excess copper and barrier metal from the surface, so that the only copper and barrier metal remaining are in the via/trench openings. Then an overlying silicon nitride (SiN) layer is formed above the exposed copper in order to form a dielectric barrier layer. The copper interconnect is fully encapsulated from the adjacent material by the TiN (or Ta) barrier layer and the overlying SiN layer.

In one embodiment, electroless copper deposition technique is used to form plugs in via openings. In another embodiment, the electroless copper deposition technique is used to form wiring in trench openings. Still in another embodiment employing the Damascene structure, both plugs and wiring are formed during the same electroless copper deposition process. In all instances, autocatalytic process for the electroless deposition of copper is commenced on the catalytic seed layer, which is kept protected by the presence of the overlying protective layer.

DETAILED DESCRIPTION OF THE PREFERRED EMBODIMENTS

A technique for utilizing electroless metallization to form copper (Cu) wiring and plug structures by employing a copper catalytic layer to initiate the electrolessly deposition process, but wherein the catalytic copper surface is protected until the wafer is subjected to the electroless deposition solution is described. In the following description, numerous specific details are set forth, such as specific materials, structures, chemicals, processes, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention.

Furthermore, it is appreciated that the fabrication of a multiple-metal layer structure atop a substrate, such as a silicon substrate, to manufacture a semiconductor device is well-known in the art. Generally, dielectric materials, such as silicon dioxide ($SiO_2$), are utilized to separate the conductive regions. Contact openings are formed in the dielectric overlying the substrate region to provide conductive pathways to the source, drain and gate regions from a first metal layer. Via openings are formed in the subsequent inter-level dielectric (ILD) layers separating the various metal layers to provide conductive pathways between the metal layers. One such exemplary multiple metal layer structure is described in "Planar Copper-Polyimide Back End Of The Line Interconnections For ULSI Devices;" B. Luther et al.; 1993 VMIC Conference; Jun. 8–9, 1993; pp. 15–21. Accordingly, it is appreciated that the Figures provided herein illustrate only portions of an exemplary semiconductor device which pertain to the practice of the present invention. Thus, the present invention is not limited to the structures described herein.

Figure 1:
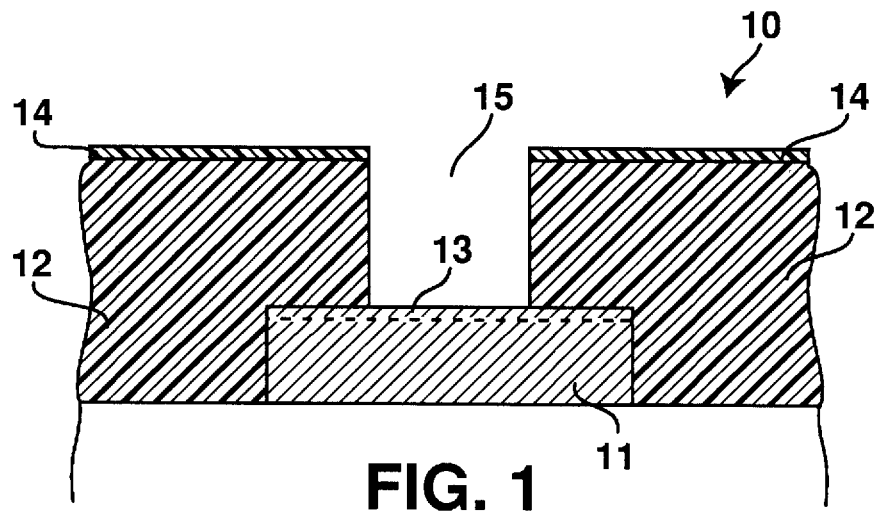
FIG. 1 is a cross-sectional view of an interconnect structure for a semiconductor device showing an underlying metal layer overlaid with an inter-level dielectric (ILD) layer, but in which a via opening is formed in the ILD layer to expose a portion of the underlying metal layer.

Referring to FIG. 1, an exemplary semiconductor structure 10 is shown having a metal layer 11 which is covered by an ILD layer 12. Metal layer 11 is representative of one of the metal layers in a multiple metal level semiconductor device. Layer 12 is typical of an ILD layer which is used to separate the different metal layers. Generally, metal 11 resides atop a dielectric material (which could be part of layer 12), but what comprises the underlying material is not critical to the understanding of the practice of the present invention. Also, it is understood that structure 11 is only a portion of many structures present on a semiconductor wafer.

Metal layer 11 may have a barrier metal layer 13 (which can also operate as an anti-reflection and/or electromigration/stress migration suppression layer) overlying the actual metal, but a presence of such a barrier layer 13 is also not pertinent to the practice of the present invention. Accordingly, in the subsequent Figures following FIG. 1, barrier layer 13 is not shown. However, it is understood that the present invention can be practiced with or without such a barrier (or anti-reflection or electromigration/stress migration suppression) layer 13 atop metal layer 11. One of the more preferred materials for forming barrier layer 13 is titanium nitride (TiN). The purpose of the barrier layer is to prevent the diffusion of a metal across the barrier.

The ILD layer 12 may have a thin etch stopping layer 14 at its upper surface. Layer 14 can also be used as a CMP stopping layer as well, so that excessive polishing of the ILD layer 12 is prevented. ILD layer 12 is typically formed from an oxide material, such as silicon dioxide ($SiO_2$). It is appreciated that other materials, such as low dielectric constant materials, polymer and polyimide materials, as well as other non-conductive materials, can be utilized for ILD layer 12. In the practice of the preferred embodiment, it is preferred to have SiN (or equivalent material) as layer 14. A typical approximate thickness of the SiN layer 14 is 1000 angstroms. The depositing of SiN, such as by CVD, is known in the art.

Subsequently, by the use of a known process, a via opening 15 (also referred to as via hole or via) is made in ILD 12 in order to provide a pathway to metal layer 11. The via opening 15 will be eventually filled with a conductive material to form a plug interconnect between metal 11 and an overlying metal layer which will be formed above the ILD layer 12. It is appreciated that the structure 10 of FIG. 1 can be fabricated from a variety of known processes.

Figure 2:
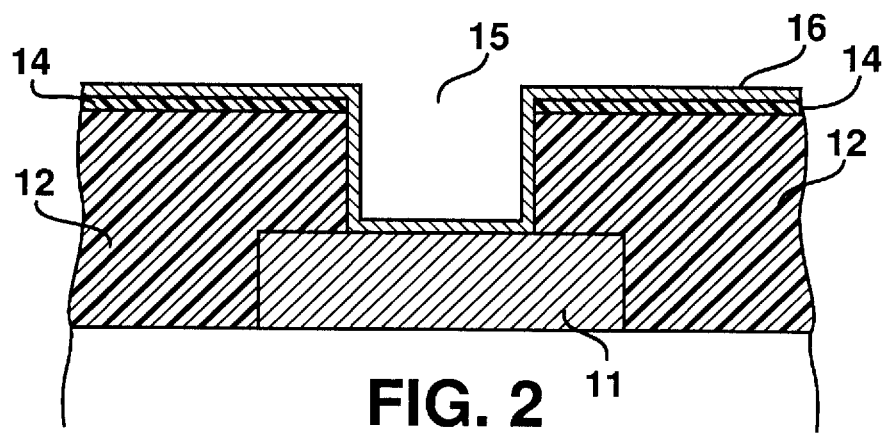
FIG. 2 is a cross-sectional view of the structure of FIG. 1 in which an adhesion promoter layer is blanket deposited over the ILD and in the via opening.

Referring to FIGS. 2–9, a technique of the present invention for forming a copper plug by a technique of using a copper catalytic layer to initiate the electroless deposition process, but in which the catalytic layer is encapsulated with a protective layer until the commencement of the electroless deposition process is described. In FIG. 2, an adhesion promoter layer 16 is conformally blanket deposited on the structure 10 of FIG. 1, including within via opening 15. In the preferred embodiment, titanium (Ti) is deposited by chemical vapor deposition (CVD) or physical vapor deposition (PVD) to form layer 16. A common practice for performing PVD is by sputtering. The thickness of adhesion promoter layer 16 is in the approximate range of 50–500 angstroms. It is to be appreciated that the adhesion promoter layer 16 is not necessary, but is desirable in order to promote adhesion of the subsequent barrier layer. The purpose of the adhesion promoter layer 16 is to improve the adhesion of the next layer (which will be a metal barrier layer) to the dielectric layer (in this instance, ILD 12).

Figure 3:
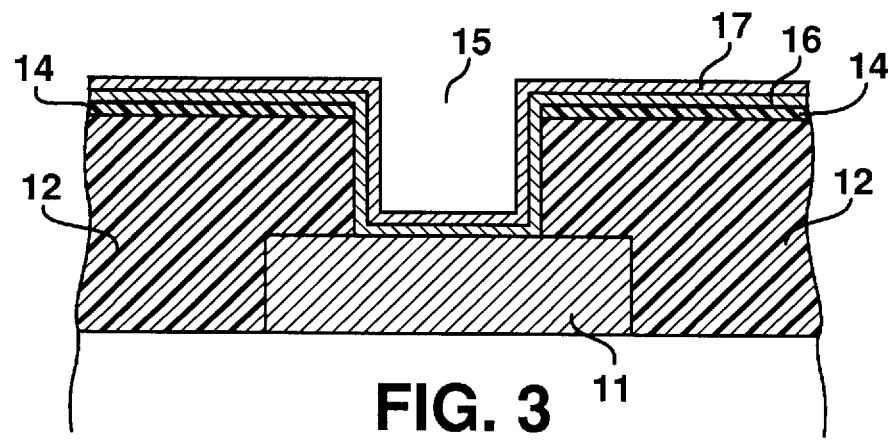
FIG. 3 is a cross-sectional view of the structure of FIG. 2 in which a barrier layer is blanket deposited over the adhesion promoter layer, including in the via opening.

Then, as shown in FIG. 3, a barrier layer 17 is conformally blanket deposited over the adhesion promoter layer 16. Although a variety of barrier metals can be used for layer 17, the preferred embodiment uses titanium nitride (TiN) or tantalum (Ta). TiN can be deposited by CVD or PVD to form layer 17. Ta can be deposited by PVD to form layer 17. The typical thickness of barrier layer 17 is in the approximate range of 50–1500 angstroms. It is to be noted that if the barrier layer 17 is Ta, then adhesion promoter layer 16 may not be needed. However, if the barrier layer 17 is TiN, then the adhesion promoter layer 16 is desirable for optimum performance of the present invention.

Figure 4:
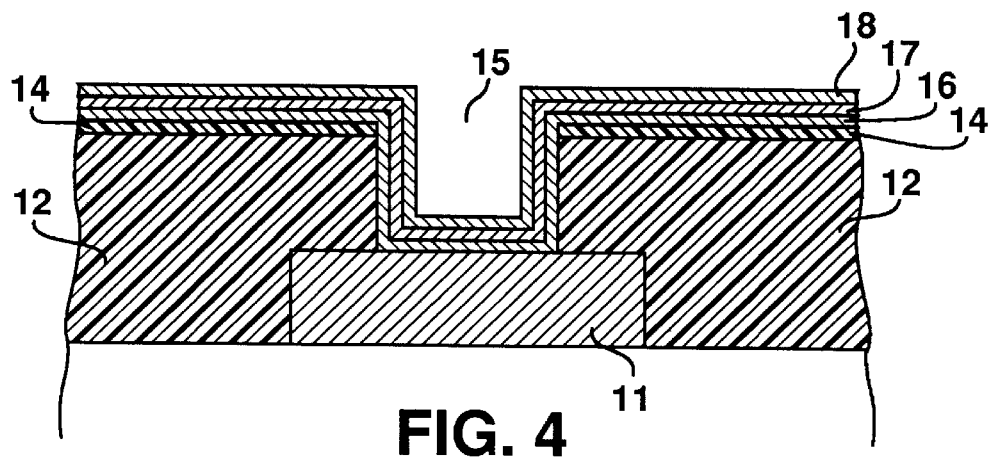
FIG. 4 is a cross-sectional view of the structure of FIG. 3 in which a catalytic seed layer is blanket deposited over the barrier layer, including in the via opening.

Next, as shown in FIG. 4, a copper catalytic seed layer 18 is conformally blanket deposited over the TiN (or Ta) barrier layer 17. The catalytic copper layer 18 of the preferred embodiment is formed by PVD deposition of copper in vacuum onto the barrier layer 17 to have a thickness in the range from several atomic monolayers to 1000 angstroms. Sufficient thickness (more than a monolayer of copper) of layer 18 must be present, since some of the copper atoms will be consumed during a later step when a protective layer is formed on the catalytic layer 18. The catalytic layer 18 operates as a seed layer for the subsequent electroless copper deposition.

Figure 5:
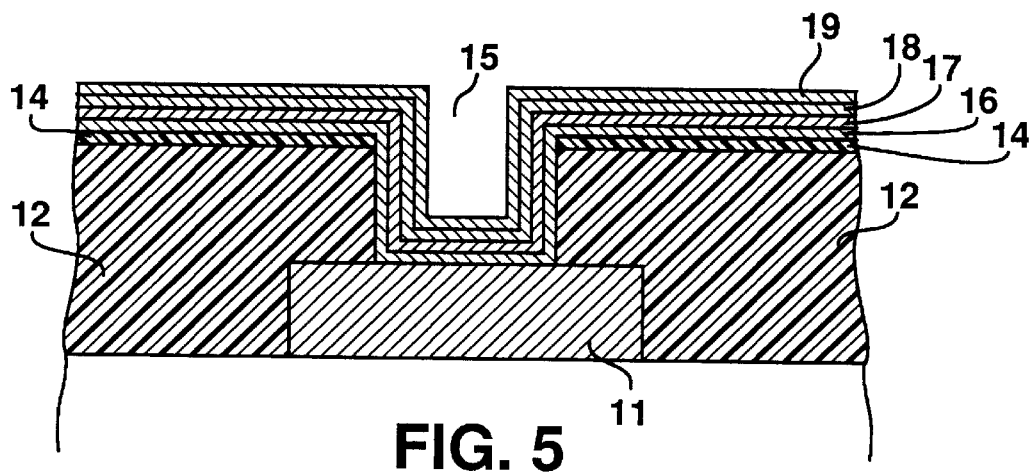
FIG. 5 is a cross-sectional view of the structure of FIG. 3 in which a protective layer is blanket deposited over the catalytic layer, including in the via opening.

Subsequently, as shown in FIG. 5, without breaking vacuum, a protective layer 19 is PVD deposited over the catalytic layer 18. In the preferred embodiment the protective layer 19 is comprised of aluminum (Al). The aluminum is deposited to an approximate thickness of 100 to 500 angstroms. During the aluminum deposition, a Cu—Al alloy forms at the interface of the layers 18 and 19. Because some of the copper atoms of the catalytic layer 18 are consumed to form the CuAl alloy, sufficient thickness of copper is desirable for layer 18. It is to be noted that by utilizing the same deposition chamber for the depositing of the copper layer 18 and protective layer 19, the vacuum seal can be maintained between the two processing steps, so that the copper catalytic layer 18 is not exposed to the ambient.

In the formation of the layers 16–19, it is preferable not to "break" the vacuum seal at all, if possible. Thus, the use of cluster tools for processing the wafer is desirable, but not necessarily needed. It is to be noted that the vacuum seal can be broken between the formation of layer 16 and layer 17, as well as between layer 17 and layer 18. However, it is critical that the vacuum seal not be broken for the deposition of the copper catalytic layer 18 and the subsequent protective layer 19. Exposing the copper to the ambient causes the copper to oxidize and its catalytic property to deteriorate. The purpose of the protective layer 19 is to coat the copper catalytic layer 18, so that when the vacuum seal is eventually broken at the end of this step and the wafer is exposed to the ambient, the copper will not be oxidized. Thus, the Al functions to coat the copper layer 18 and prevents the oxidation of the copper while the wafer is being transported to the next station for the subsequent electroless copper deposition step.

It is appreciated that the various layers 16–19 can be formed from other materials than what is described above. For example, adhesion promoter layer 16 can be formed from other materials such as Chromium (Cr), Tantalum (Ta), Vanadium (V) and Molybdenum (Mo). For barrier layer 17, other materials which can be used are Ti, tungsten (W), WN, TiSiN, TaSiN and TaN. The catalytic seed layer 18 can also be comprised of nickel (Ni), cobalt (Co) silver (Ag), gold (Au), palladium (Pd), Platinum (Pt) or Rhodium (Rh), along with the previously mentioned copper. These metals will form alloys when capped with an aluminum protective layer 19. Such alloys being Ni—Al, Co—Al, Ag—Al, Au—Al, Pd—Al, Pt—Al or Rh—Al.

Figure 6:
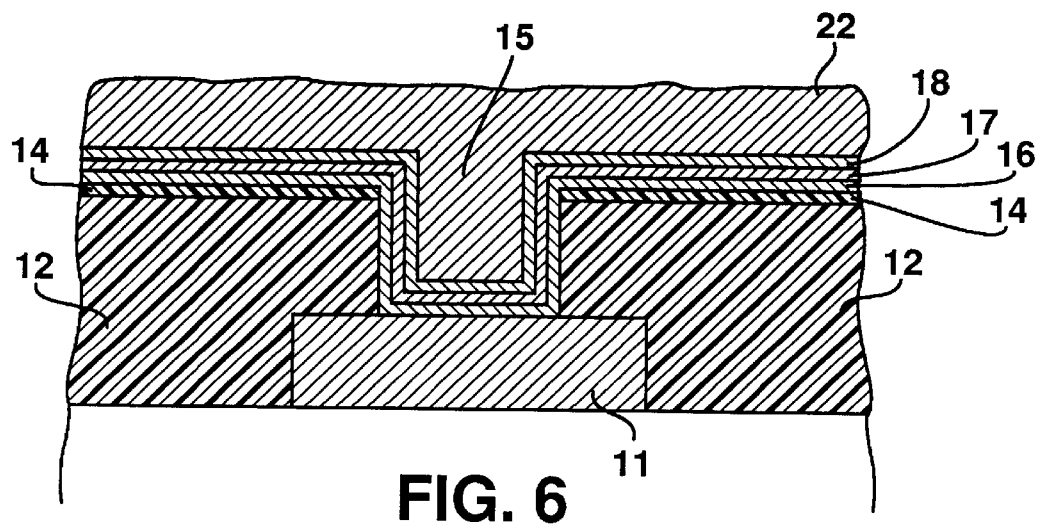
FIG. 6 is a cross-sectional view of the structure of FIG. 5 in which copper is electrolessly deposited onto the surface of the catalytic layer once the overlying protective layer is dissolved when subjected to the electroless deposition solution.

Then, as shown in FIG. 6, electroless copper deposition growth is performed in a copper solution. The Al layer 19, as well as the underlying alloy layer at the layer 18/19 interface will dissolve when subjected to the electroless deposition bath, thereby exposing the underlying catalytic layer 18 for the electroless deposition of copper to occur. The dissolving of layer 19 allows copper to be deposited on a non-contaminated and non-oxidized copper surface of catalytic layer 18. At the conclusion of the electroless copper deposition process a copper layer 22 is formed over layer 18. The electroless copper deposition process must be of sufficient duration to completely fill in via opening 15. One of a variety of known electroless copper deposition solutions can be utilized to electrolessly deposit copper on layer 18. However, with the practice of the present invention, the electroless copper deposition is performed in the following solution.

The electroless solution of the preferred embodiment is comprised of copper sulfate to supply the $Cu^{2+}$ cations, ethylenediaminetetraacetic acid (EDTA) as a complexing agent for $Cu^{2+}$ cations, quaternary ammonium hydroxides or potassium hydroxide (KOH) to supply the $OH^-$, formaldehyde (HCHO) or glyoxylic acid as a reducing agent, RHODAFAC RE 610 or polyethylene glycols as a surfactant and wetting agent, and ammonium cyanide or 2,2''-dipyridyl as stabilizer and ductility promoter.

The particular solution concentration for the solution of the preferred embodiment is mixed in DI water and is comprised of 0.016–0.08 mol/liter of copper sulfate ($CuSO_4$), 0.04–0.2 mol/liter of EDTA, 0.13–1 mol/liter of formaldehyde, 0.06–0.2 mol/liter of glyoxylic acid, 0.01 mol/liter of ammonium cyanide, 10–120 parts-per-million (ppm) of 2,2'-dipyridyl, 50–100 ppm of polyethylene glycol and 0.01–10 gm/liter of RHODAFAC RE 610. Also, sufficient tetramethylammonium hydroxide (TMAH) or potassium hydroxide is added to adjust the pH of the solution to a range of 11–13. The electroless bath is maintained at a temperature in the range of 30°–80° C.

The amount of reducing agent and complexing agent are dependent upon the amount of cupric ions present in the solution. Electroless copper deposition reaction can be expressed as:

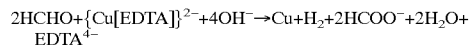

According to the above equation, the ratio between the components in the solution must be in molar as:

1 mol $Cu^{2+}$:2 mol HCHO:1 mol $EDTA^{4-}$

After the electroless deposition of copper, the wafer is rinsed in DI water again to remove the electroless deposition solution.

Figure 7:
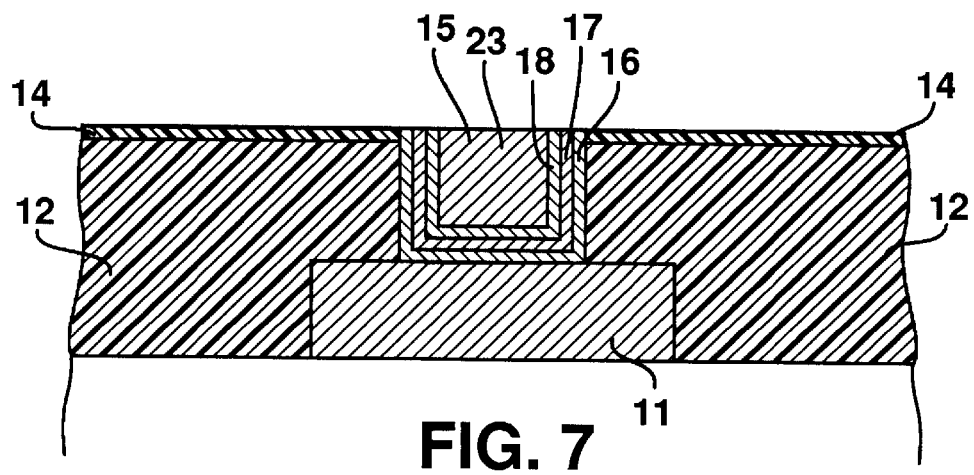
FIG. 7 is a cross-sectional view of the structure of FIG. 6 in which the excess copper above the ILD is polished away by performing CMP to form a copper plug in the via opening.

Then, as shown in FIG. 7, the excess copper 22 is removed so that the only copper remaining forms a copper plug 23 within via opening 15. Although an etch-back process known in the art can be used, the preferred technique is to polish using CMP. CMP is employed to polish away the copper layer 22 and other layers 16–18 above the ILD layer 12. The SiN layer 14 operates as an etch stop so that the polishing process will stop when layer 14 is reached. Thus, the only remaining copper 22 and the layers 16–18 are within via 15 to form the plug 23. The barrier layer 17 functions to isolate the copper plug 23 from the surrounding ILD 12, as well as the underlying metal 11.

Figure 8:
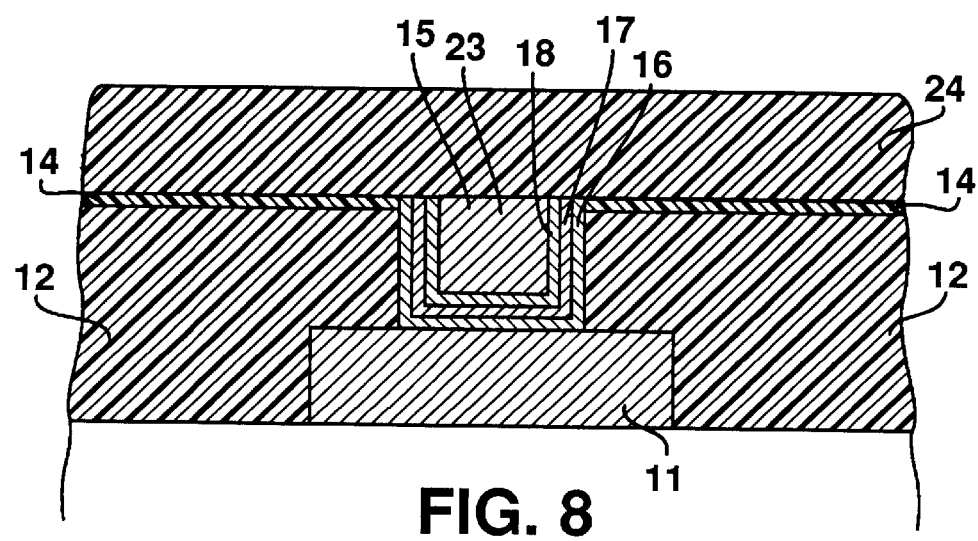
FIG. 8 is a cross-sectional view of the structure of FIG. 7 in which an overlying dielectric layer is formed above the copper formation in the via opening.

Next, as shown in FIG. 8, a dielectric layer 24 is formed over the copper plug 23 and ILD 12 (including any remaining SiN layer 14). The dielectric layer 24 is similar to ILD layer 12 in that it is typically formed from an oxide material, such as $SiO_2$. It is appreciated that other materials, such as low dielectric constant materials, polymer and polyimide materials, as well as other non-conductive materials, can be utilized for layer 24.

Figure 9:
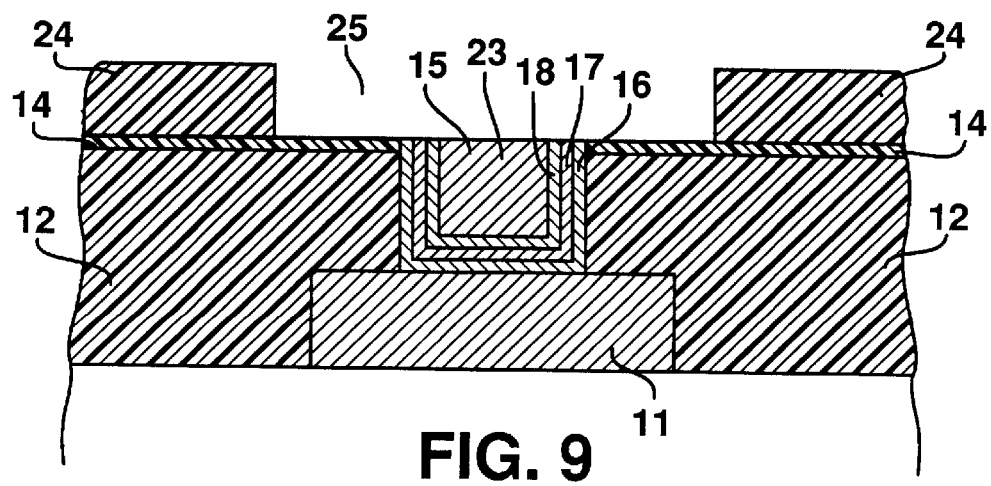
FIG. 9 is a cross-sectional view of the structure of FIG. 8 in which a trench opening is formed in the overlying dielectric layer to obtain access to the copper filled via.

Then, as shown in FIG. 9, a trench opening 25 is formed in the dielectric layer 24 to expose the plug 23 by utilizing one of a variety of known etching techniques to form trench 25. In this instance, SiN layer 14 serves as an etch stop during the etching step to form trench 25. An upper level metal layer will then be formed within trench 25. Thus, plug 23 will function as an interconnect between the lower metal layer 11 and the upper metal layer which will be formed within trench 25. As noted, a protected (encapsulated) catalytic layer 18 is formed by the formation of the protective layer 19 and this encapsulation of the catalytic layer 18 is maintained until the electroless deposition process is commenced. The formed plug 23 is also encapsulated in that the barrier layer 17 isolates the plug 23 from the surrounding medium. The top of the plug is not covered, since it is anticipated that copper wiring will be formed within trench 25. However, a barrier layer can be readily formed atop plug 23 (if desired) to fully encapsulate the plug 23.

Figure 10:
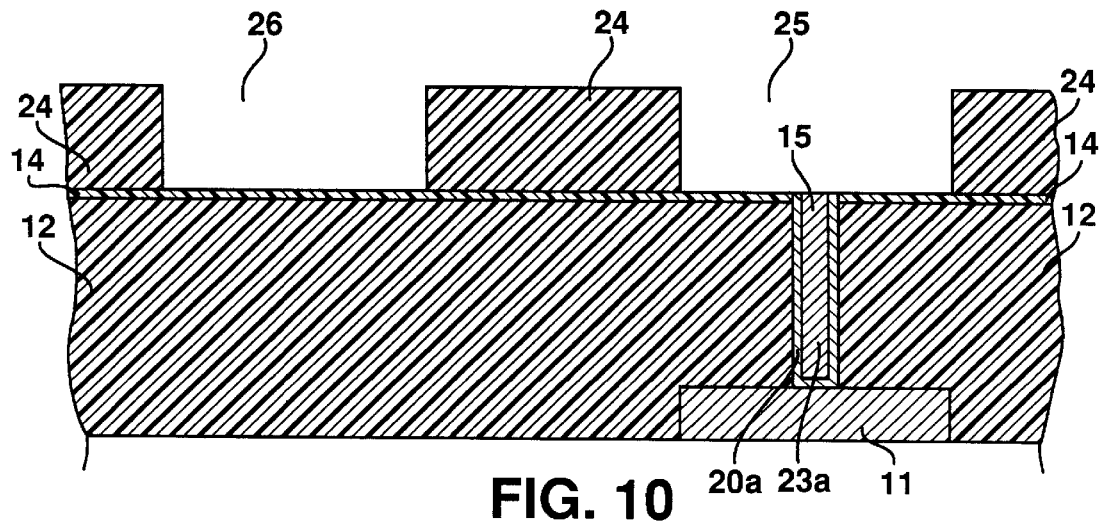
FIG. 10 is a cross-sectional view of an interconnect structure for a semiconductor device showing a formation of two trenches for laying wiring lines and in which one of the trenches has an underlying via for an interconnection to a lower metal layer, which is separated from the trench formation by an ILD layer.

Referring to FIGS. 10–14, an alternative embodiment is shown in which the electroless copper deposition technique of the present invention is used to deposit copper in trench regions of a semiconductor structure. In FIG. 10, two trenches 25 and 26 are shown formed above ILD layer 12. As noted, SiN layer 14 may be present at the upper surface of ILD layer 12 to function as an etch stop. Trench 25 is equivalent to trench 26, except that it has an interconnect to a lower metallization layer 11, as illustrated in FIG. 10. The underlying interconnect structure of trench 25 is the plug 23 described above. However, it is appreciated that the following description pertaining to the electroless deposition of copper in the trenches 25–26 can be done with via interconnect structures currently know in the art. Thus, the plug underlying trench 25 could be of aluminum or tungsten (although the preference is for copper). Also, for purposes of simplification, FIGS. 10–14 show via 15 having a plug 23a with a single layer of encapsulation 20a. However, it is appreciated that the protected catalytic layer technique of the present invention described above can be implemented for layer 20a.

Figure 11:
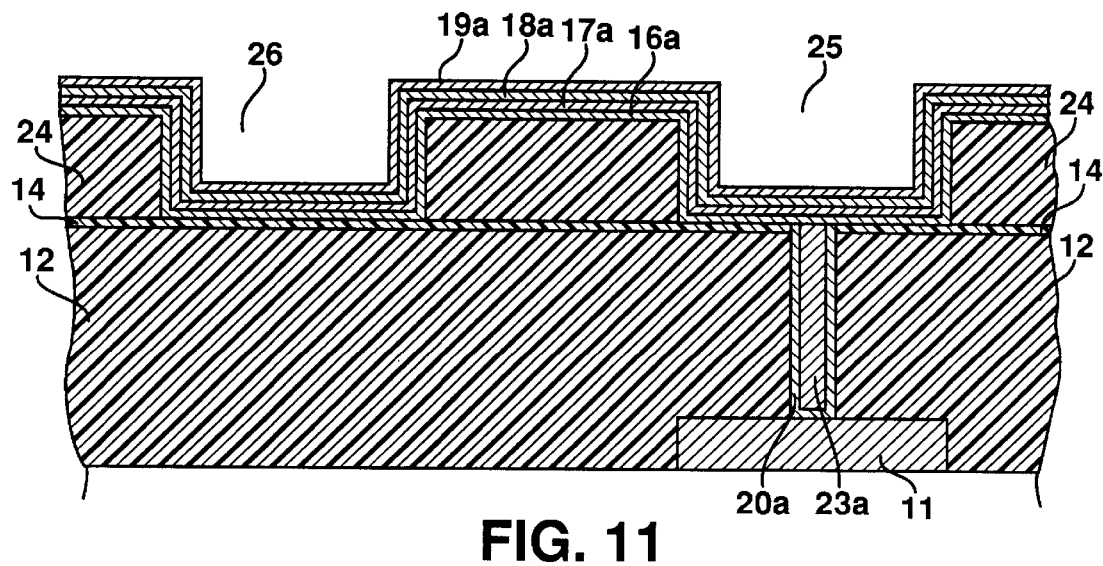
FIG. 11 is a cross-sectional view of the structure of FIG. 10 in which the adhesion promoter layer, barrier layer, catalytic seed layer and protective layer shown in FIGS. 2–5 are formed by blanket deposition over the ILD and in the trench openings.

The technique for the formation of the copper in the trenches 25–26 is equivalent to the earlier described technique of forming the copper plug 23 in via 15. Accordingly, as shown in FIG. 11, an adhesion promoter layer 16a (again this is an optional layer), barrier layer (preferably TiN or Ta) 17a, catalytic seed layer 18a (preferably Cu) and protective layer 19a (preferably Al) are all conformally blanket deposited using the techniques described in reference to layers 16–19 of FIGS. 2–5. Again it is preferable not to break the vacuum seal at all, but it is critical that the seal not be broken between the formation of the catalytic layer 18a and the subsequent protective layer 19a.

Figure 12:
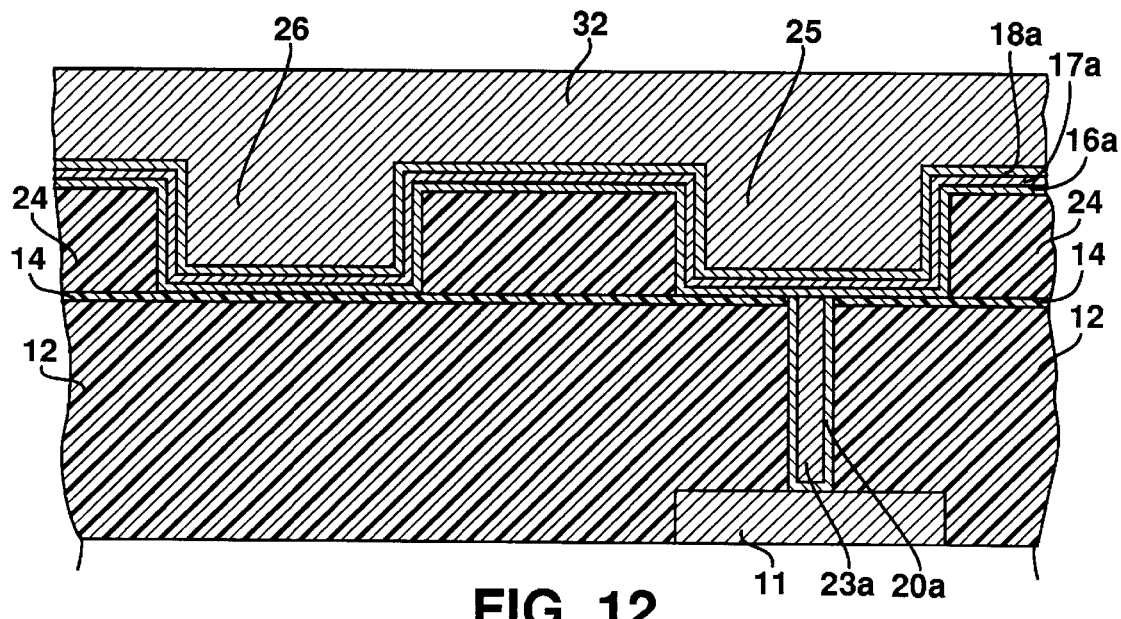
FIG. 12 is a cross-sectional view showing the structure of FIG. 11 in which copper is electrolessly deposited onto the surface of the catalytic layer once the overlying protective layer is dissolved when subjected to the electroless deposition solution.

Next, as shown in FIG. 12, copper is deposited by the electroless technique earlier described for the formation of copper layer 22 to form electrolessly deposited copper layer 32. With sufficient copper deposit, copper layer 32 will fill in the trenches 25–26. The aluminum protective layer 19a will dissolve in the electroless copper deposition bath when the wafer is immersed in the bath. Copper growth is timed to ensure that the trenches are filled completely.

Figure 13:
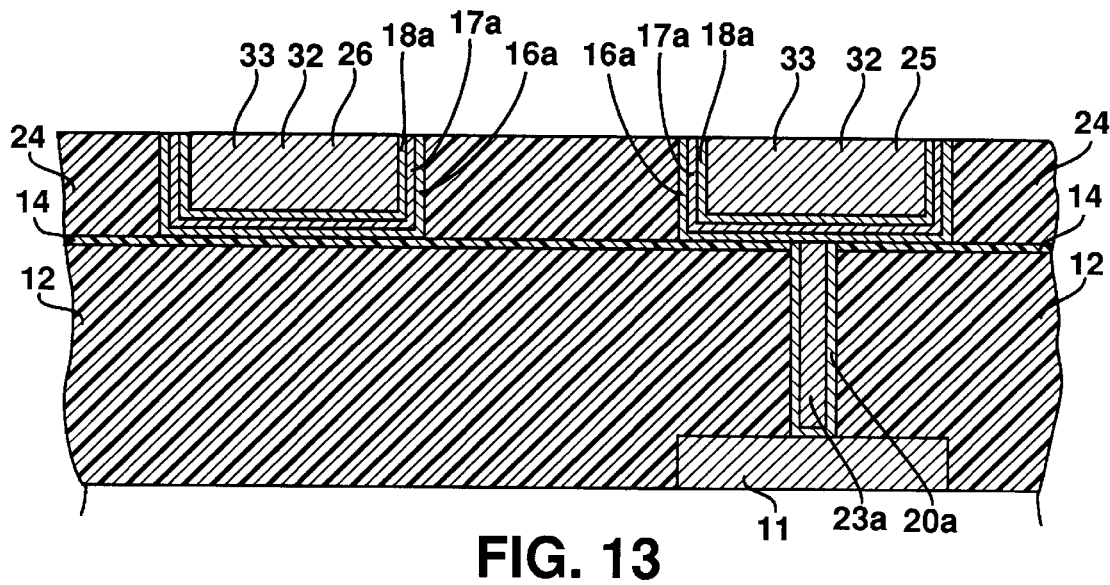
FIG. 13 is a cross-sectional view of the structure of FIG. 12 in which the excess copper above the ILD is polished away by performing CMP to form copper wiring in the trench openings.

Subsequently after a rinse in DI water, as shown in FIG. 13, CMP is used to polish away the excess copper and the layers 16a–18a outside of the trenches 25–26. The dielectric layer 24 operates as a CMP stop during the metal CMP of copper layer 32. The CMP process has been described earlier in the formation of plug 23. The copper left in trenches 25–26 now form copper contact lines 33 with the barrier layer 17a functioning as a barrier between the copper wiring 33 and the dielectric 24.

Figure 14:
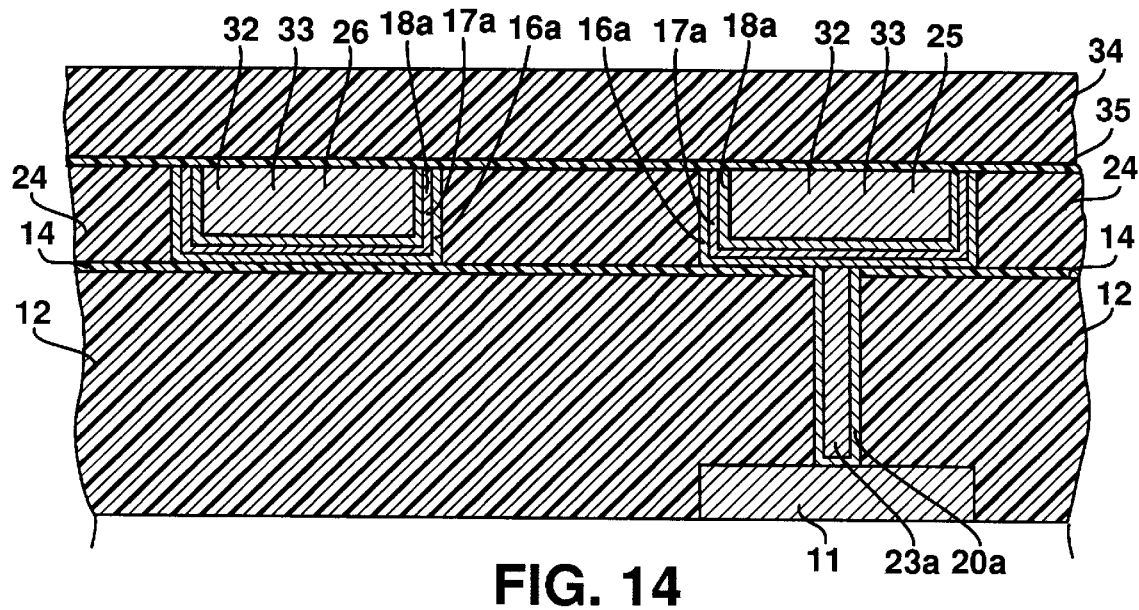
FIG. 14 is a cross-sectional view of the structure of FIG. 13 in which overlying dielectric layers are formed above the copper formation in the trench openings.

Then, as shown in FIG. 14, a subsequent ILD layer 34 can then be formed equivalent to the formation of ILD layer 12. However, prior to the formation of the ILD layer 34, it is necessary to deposit a SiN layer 35, such as by CVD. The SiN layer 35 covers the copper wiring 33 in trenches 25–26 and this layer 35 functions as a dielectric barrier layer to encapsulate the copper 33. Vias then can be formed in ILD 34 for further interconnections to interconnect lines 33 to subsequently formed overlying metal layers. Thus, as noted in FIG. 14, copper wiring 33 is fully encapsulated by the barrier layer 17a and the dielectric barrier layer 35.

Figure 15:
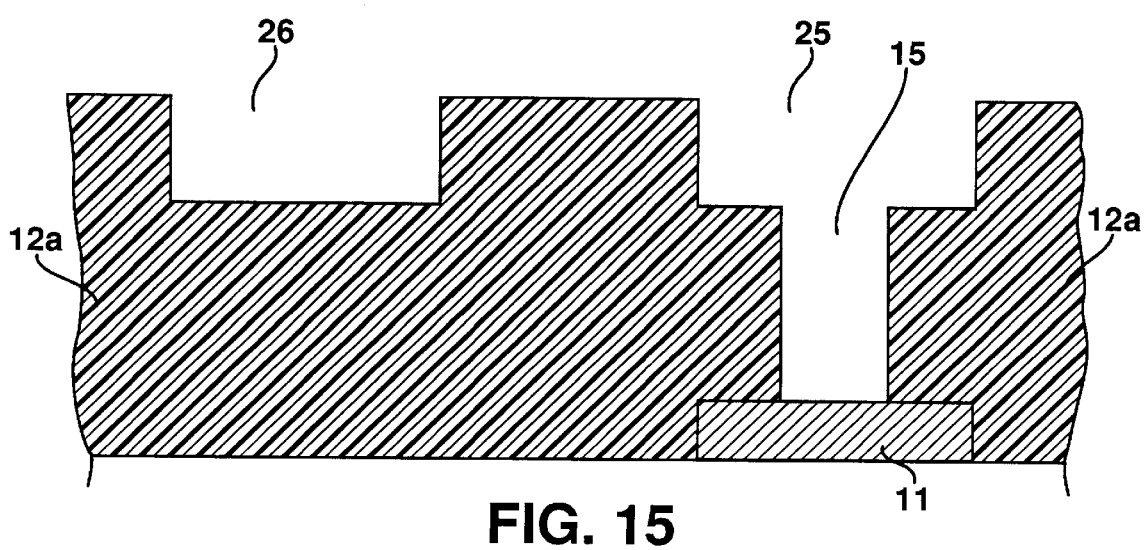
FIG. 15 is a cross-sectional view of an interconnect structure for a semiconductor device showing a formation of two trenches for laying wiring lines and in which one of the trenches has an underlying via opening for an interconnection to a lower metal layer, which is separated from the trench formation by an ILD layer.

FIGS. 15–19 illustrate still another embodiment of the present invention. In this embodiment both vias and trenches are filled together in the same processing steps using the technique of the present invention. FIG. 15 shows a structure in which trenches 25 and 26 are formed along with the formation of via 15. A structure of this sort can be fabricated utilizing a dual Damascene process (see for example, the afore-mentioned U.S. Pat. No. 4,789,648). Thus, as shown in FIG. 15, trenches 25–26 have been formed in ILD layer 12a with a via opening 15 under trench 25 for interconnection to the lower metal layer 11.

Figure 16:
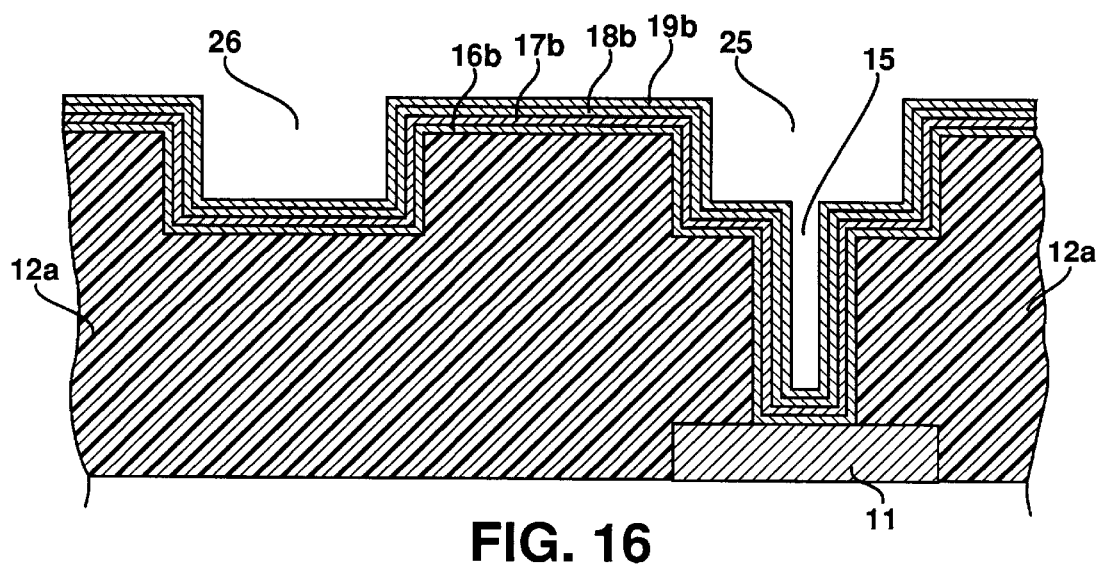
FIG. 16 is a cross-sectional view of the structure of FIG. 15 in which the adhesion promoter layer, barrier layer, catalytic seed layer and protective layer shown in FIGS. 2–5 are formed by blanket deposition over the ILD and in the trench openings and via opening.
Figure 17:
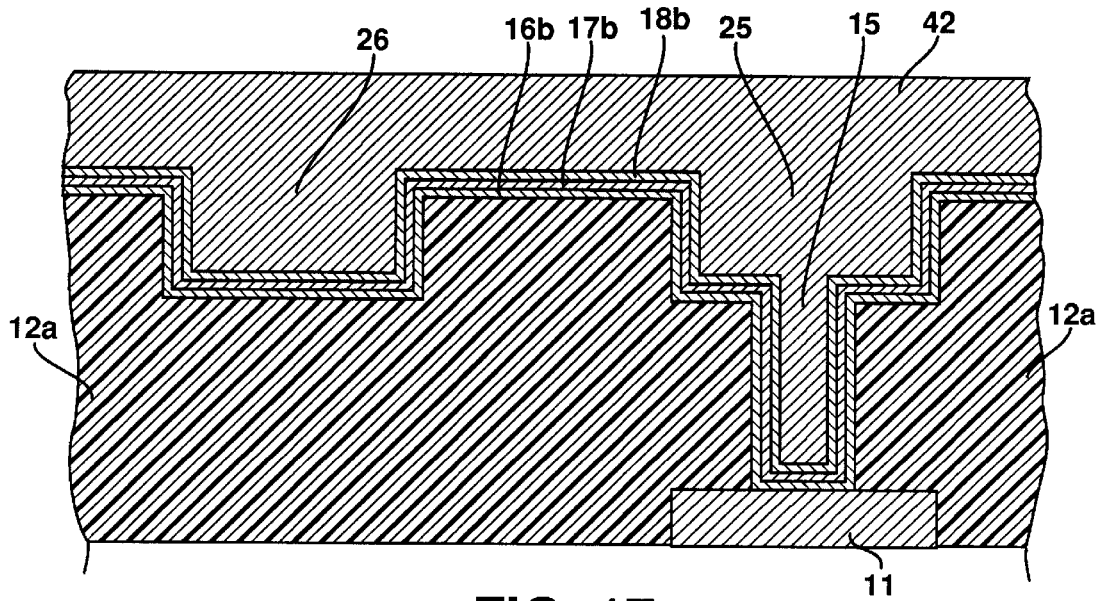
FIG. 17 is a cross-sectional view showing the structure of FIG. 16 in which copper is electrolessly deposited onto the surface of the catalytic layer once the overlying protective layer is dissolved when subjected to the electroless deposition solution.

Instead of filling the via first and then the trenches next (as was described above), an adhesion promoter layer 16b, barrier layer 17b, catalytic seed layer 18b and protective layer 19b are conformally blanket deposited into all of the openings 15, 25–26 as shown in FIG. 16 using the technique described above for the layers 16–19 (and 16a–19a). Again it is an option to use the adhesion promoter layer 16b. Then, as shown in FIG. 17, copper is electrolessly deposited to form copper layer 42 using the electroless copper deposition technique described earlier in reference to copper layers 22 and 32. The electrolessly deposited copper layer 42 fills via 15 and trenches 25–26.

Figure 18:
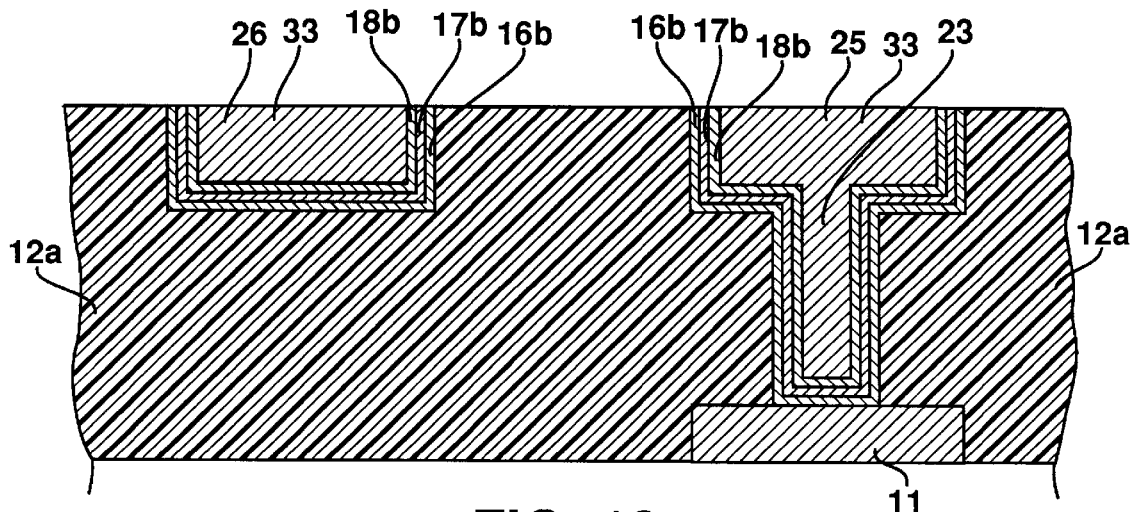
FIG. 18 is a cross-sectional view of the structure of FIG. 17 in which the excess copper above the ILD and the trenches is polished away by performing CMP.
Figure 19:
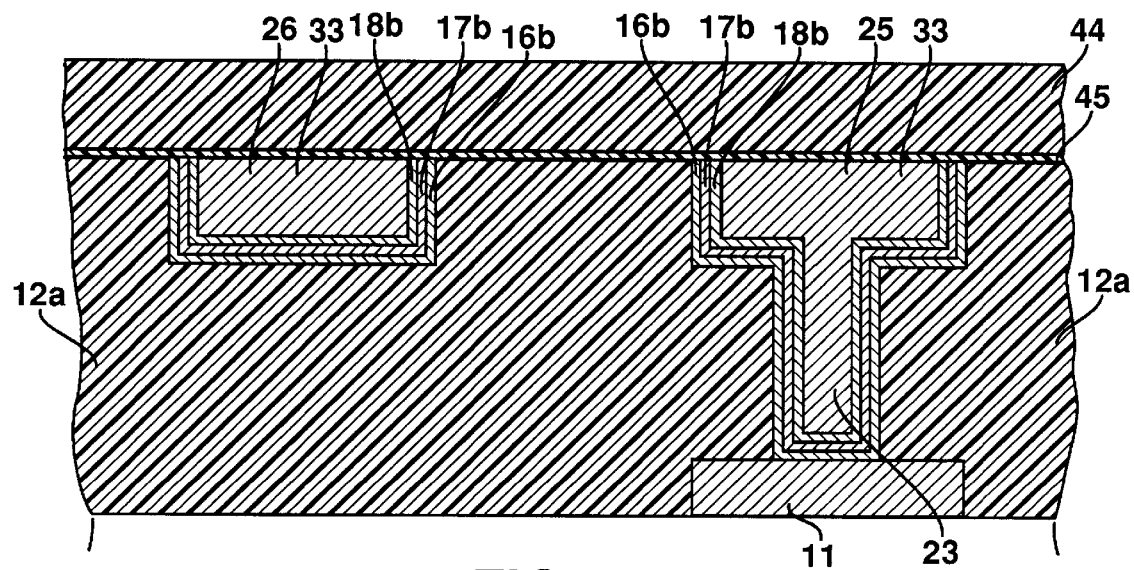
FIG. 19 is a cross-sectional view of the structure of FIG. 18 in which an overlying dielectric layers are formed above the copper formation in the trench openings.

Next after a rinse, as shown in FIG. 18, CMP is used to polish the excess copper and layers 16b–18b (protective layer 19b already being dissolved in the copper deposition bath) above dielectric layer 12a, in order to form plug 23 and lines 33. Then, as shown in FIG. 19, an overlying SiN layer 45 is formed, followed by an ILD layer 44. The copper interconnect structures, whether just the wiring as shown in trench 26 or the plug/wiring combination of via 15 and trench 25, are fully encapsulated by the TiN (or Ta) and SiN barrier layers 17a and 45 to completely isolate the copper from the adjacent material.

An advantage of utilizing the present invention with the dual Damascene structure of FIG. 15 is quite evident. The electroless copper deposition technique of the present invention can be used to fill both the via and the trenches during the same process steps, so that the process need not be repeated twice, once for the plug and the second time for the wiring.

Figure 20:
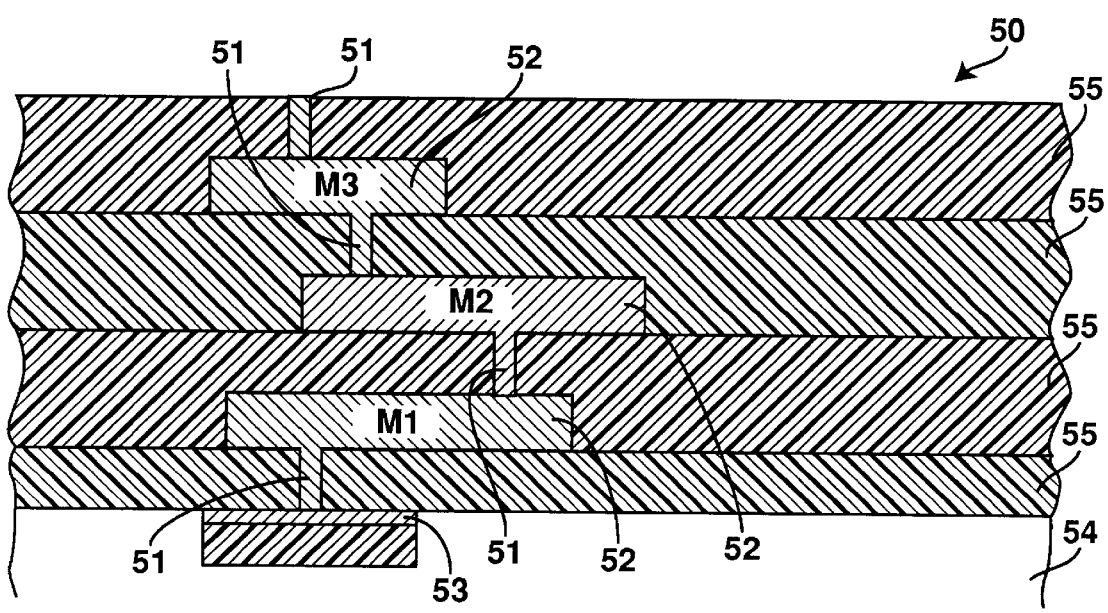
FIG. 20 is a cross-sectional view of a semiconductor device having four metal layers and a doped region in a substrate and in which via and contact openings are filled to interconnect the various conductive regions.

FIG. 20 shows a three-metal level structure 50 in which the metal levels are designated M1, M2 and M3, separated by dielectric layers 55. Plugs 51 are used to couple the metal lines 52 and the M1 level to a contact region 53 on the substrate 54. It is appreciated that the present invention can be readily used to provide for the various plugs 51 and metal lines 52 shown in FIG. 20 in the fabrication of semiconductor device.

Accordingly, an electroless copper deposition technique is described in which advantages associated with the use of copper for conductive paths in a semiconductor device are inherently present in the practice of the present invention. The present invention is not limited to the size of the device or the via opening, but has advantages at smaller sized dimensions in the submicron range (typically in the approximate range of 0.2–0.8 $\mu$m). The electroless copper deposition can be performed as a batch process in which a substantial number of wafers can be immersed in the wet bath at the same time. The protected encapsulation of the copper catalytic layer ensures that the seed copper needed for the electroless deposition step is not oxidized and maintains the same catalytic property.

Additionally, a variety of metallic barrier materials or dielectric materials can be used atop via and trench openings to encapsulate the copper. In the description, SiN is used as the preferred material for the dielectric barrier material, but other materials can be used without departing from the scope and spirit of the present invention.

Furthermore, although the present invention is described in reference to openings for forming vias and trenches, the present invention can be readily extended to contact openings as well. In that instance, the underlying region would not be a metal layer (such as described in relation to vias), but rather such underlying regions would be doped contact regions or silicide regions of a contact (see, for example, FIG. 20). Thus, interconnect structures implementing the present invention can extend to those conductive regions referred to as contacts.

Thus, a technique for utilizing electroless metallization to deposit using a copper catalytic layer which is kept in its pristine unoxidized form until the electroless metallization step is described.

We claim:

1. A method of forming a protected catalytic seed surface in order to deposit metal by electroless deposition to form an interconnect structure on a semiconductor wafer, comprising the steps of:

depositing a barrier layer;

depositing a catalytic seed layer on said barrier layer under vacuum;

depositing a protective layer over said catalytic seed layer without breaking vacuum seal from the previous step in order to prevent oxidation of said catalytic seed layer;

subjecting said wafer to an electroless deposition solution, wherein said electroless deposition solution dissolves said protective layer to expose said underlying catalytic seed layer, which then allows copper to be electrolessly deposited thereon.

2. The method of claim 1 wherein said barrier layer is formed by depositing TiN, Ta, Ti, W, WN, TiSiN, TaSiN or TaN.

3. The method of claim 2 wherein said catalytic seed layer is formed by depositing Ni, Co, Ag, Au, Pd, Pt, Rh or Cu.

4. The method of claim 3 wherein said protective layer is formed by depositing Al.

5. In a fabrication of a semiconductor device, a method of forming a protected catalytic seed surface on a barrier metal in order to deposit metal by electroless deposition to form an interconnect structure on a semiconductor wafer, comprising the steps of:

depositing a metal barrier layer;

depositing a catalytic metal on said metal barrier layer under vacuum in order to form a catalytic seed surface for electroless deposition of copper;

depositing a protective layer to coat said catalytic seed surface without breaking vacuum seal from the previous step, in order to prevent oxidation of said catalytic seed surface when said wafer is removed from said vacuum;

subjecting said wafer to an electroless deposition solution, wherein said electroless deposition solution dissolves said protective layer to expose said underlying catalytic seed surface, which then allows copper to be electrolessly deposited thereon.

6. The method of claim 5 wherein said barrier layer is formed by depositing TiN, Ta, Ti, W, WN, TiSiN, TaSiN or TaN.

7. The method of claim 6 wherein said catalytic surface is formed by depositing Ni, Co, Ag, Au, Pd, Pt, Rh or Cu.

8. The method of claim 7 said protective layer is formed by depositing Al.

9. In a formation of a semiconductor interconnect structure in which two conductive regions are separated by a dielectric layer and connected by said interconnect structure, a method of forming a protected catalytic seed surface on a barrier metal in order to deposit metal by electroless deposition to form an interconnect structure on a semiconductor wafer, comprising the steps of:

forming an opening in said dielectric layer;

depositing a barrier layer in said opening;

depositing a catalytic metal on said barrier layer under vacuum in order to form a catalytic seed layer for electroless deposition of copper;

depositing a protective layer to coat said catalytic seed layer without breaking vacuum seal from the previous step in order to prevent oxidation of said catalytic seed layer when said wafer is removed from said vacuum;

subjecting said wafer to an electroless deposition solution, wherein said electroless deposition solution dissolves said protective layer to expose said underlying catalytic seed layer, which then allows copper to be electrolessly deposited thereon.

10. The method of claim 9 wherein said barrier layer is formed by depositing titanium nitride or tantalum.

11. The method of claim 10 wherein said catalytic layer is formed by depositing copper.

12. The method of claim 11 wherein said protective layer is aluminum.

13. The method of claim 12 wherein said interconnect structure is a plug formed in a via opening.

14. The method of claim 13 wherein said interconnect structure is a metal line formed in a trench opening.

15. The method of claim 14 wherein said opening is for both via and trench fill and said interconnect structure forms both a plug and a metal line.

16. In a formation of a semiconductor interconnect structure in which two conductive regions are separated by a dielectric layer and connected by said interconnect structure, a method of forming a protected catalytic seed surface on a barrier metal in order to deposit metal by electroless deposition to form an interconnect structure on a semiconductor wafer, comprising the steps of:

forming an opening in said dielectric layer;

depositing a metal barrier layer in said opening;

depositing at least several mono-layers of copper atoms on said barrier layer under vacuum in order to form a copper seed layer for electroless deposition of copper;

depositing a protective layer to coat said copper seed layer without breaking vacuum seal from the previous step in order to prevent oxidation of copper when said wafer is removed from said vacuum;

subjecting said wafer to an electroless deposition solution, wherein said electroless deposition solution dissolves said protective layer to expose said underlying copper seed layer, which then allows copper for forming said interconnect structure to be electrolessly deposited thereon.

17. The method of claim 16 wherein said barrier layer is formed by depositing titanium nitride or tantalum.

18. The method of claim 17 wherein said protective layer is aluminum.

19. The method of claim 18 wherein said interconnect structure is a plug formed in a via opening.

20. The method of claim 18 wherein said interconnect structure is a metal line formed in a trench opening.

21. The method of claim 18 wherein said opening is for both via and trench fill and said interconnect structure forms both a plug and a metal line.

22. The method of claim 18 further including the step of depositing an adhesion promoter layer prior to the step of depositing said barrier layer in order to improve bonding of said barrier layer when said barrier layer is deposited.

* * * * *

UNITED STATES PATENT AND TRADEMARK OFFICE
CERTIFICATE OF CORRECTION

PATENT NO. : 5,824,599
DATED : October 20, 1998
INVENTOR(S) : Yosef Schacham Diamand et al.

It is certified that error appears in the above-identified patent and that said Letters Patent is hereby corrected as shown below:

Column 1,
Line 32, please delete "result" and insert therefore -- results --.
Line 33, please delete "enhance" and insert therefore -- enhances --.
Line 60, after the word "has", please insert -- more --.
Line 64, please delete "easier" and insert therefore -- easy --.

Column 7,
Line 60, please delete "2,2"", and insert therefore -- 2,2' --.

Column 9,
Line 4, please delete "know" and insert therefore -- known --.

Column 11, claim 8,
Line 49, after "claim 7" please insert -- wherein --.

Signed and Sealed this

Eleventh Day of December, 2001

Attest:

NICHOLAS P. GODICI
*Attesting Officer*  *Acting Director of the United States Patent and Trademark Office*